(12) United States Patent
Tokuhiro et al.

(10) Patent No.: US 6,465,285 B2
(45) Date of Patent: *Oct. 15, 2002

(54) LIQUID CRYSTAL DEVICE, LIQUID CRYSTAL DISPLAY PANEL AND METHOD FOR MANUFACTURING THE SAME

(75) Inventors: Osamu Tokuhiro, Gamou-Gun Shiga (JP); Hiroyuki Ueda, Yasu-Gun Shiga (JP); Masahiko Machida, Tokyo (JP)

(73) Assignees: International Business Machines Corporation, Armonk, NY (US); Kabushiki Kaisha Toshiba, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/409,266

(22) Filed: Sep. 30, 1999

(65) Prior Publication Data

US 2002/0090769 A1 Jul. 11, 2002

(30) Foreign Application Priority Data

Sep. 30, 1998 (JP) .............................. 10-278689

(51) Int. Cl.[7] .............................. H01L 21/00
(52) U.S. Cl. .......................... 438/153; 257/59
(58) Field of Search ............................ 438/153, 29, 30, 438/349, 187, 188, 189, 190, 191, 192; 257/72, 79

(56) References Cited

U.S. PATENT DOCUMENTS

| | | | | |
|---|---|---|---|---|
| 5,610,082 A | * | 3/1997 | Oh ................................ | 437/21 |
| 5,686,980 A | * | 11/1997 | Hirayama et al. ........... | 349/110 |
| 5,814,836 A | * | 9/1998 | Hyun ........................... | 257/72 |
| 5,844,647 A | * | 12/1998 | Maruno et al. .............. | 349/110 |
| 5,917,564 A | * | 6/1999 | Kim et al. ..................... | 349/46 |
| 6,104,042 A | * | 8/2000 | Sah .............................. | 257/59 |
| 6,218,219 B1 | * | 4/2001 | Yamazaki et al. ........... | 438/149 |

* cited by examiner

*Primary Examiner*—David Nelms
*Assistant Examiner*—David Vu
(74) *Attorney, Agent, or Firm*—Pillsbury Winthrop LLP

(57) ABSTRACT

A method of manufacturing a liquid crystal panel comprises the steps of forming a gate insulating film, a channel layer and an etching stopper layer on a transparent substrate bearing a gate electrode, exposing the substrate to light from its back surface side by using the gate electrode as a light shielding mask by photolithography, developing the resist, etching the etching stopper layer, forming a source/drain layer, and etching the source/drain layer and a remaining part of the etching stopper by chemical gas phase etching.

8 Claims, 12 Drawing Sheets

LIQUID CRYSTAL DEVICE, LIQUID CRYSTAL DISPLAY PANEL AND METHOD FOR MANUFACTURING THE SAME

BACKGROUND OF THE INVENTION

1. Field of the Invention

The present invention relates to an a-Si TFT liquid crystal device, a liquid crystal display panel and a method of manufacturing them.

2. Description of Related Art

A conventional method for manufacturing an a-Si TFT liquid crystal display panel will now be described with regard to one liquid crystal device portion. As shown in FIGS. 15(a) and 15(b), a gate electrode 4 is first formed into a predetermined shape on a glass substrate 2 by a general technique. Then, as shown in FIG. 16, a gate insulating film 6, a channel layer 8 and a $SiN_x$ film 10 serving as an etching stopper layer are successively stacked on the entire surface of the glass substrate 2. As shown in FIGS. 17(a), 17(b) and 17(c), after coating a resist on the $SiN_x$ film 10, the glass substrate 2 is exposed to light from its back surface side by using the gate electrode 4 in the predetermined shape as a light shielding mask, and is subsequently subjected to stepper exposure from its front surface side by using a reticle, and then the resist is developed. Thereafter, the $SiN_x$ film 10 other than a portion working as an etching stopper (channel protecting film) 14 is etched with diluted hydrofluoric acid, and then the resist is removed.

It is noted that the etching stopper 14 can be basically formed through a single exposing step in which the glass substrate 2 is subjected to the stepper exposure from its front surface side by using a reticle. In this conventional manufacturing method, however, the etching stopper 14 is formed through a two-stage exposing step: a stage of exposing the substrate 2 to light from its back surface side and a stage of exposing the substrate 2 to light from its front surface side. This is because, when the etching stopper 14 is formed through a single-stage exposing step in which the glass substrate 2 is exposed to light from its front surface side, the alignment with the gate electrode 4 tends to be shifted and cannot be stabilized. In contrast, if the gate electrode 4 is effectively used in the two-stage exposing step, the etching stopper 14 can be disposed at the center of the gate electrode 4 in a self-alignment manner. This results in providing a source electrode 26 and a drain electrode 28 symmetrically about the gate electrode 4, and also in reducing overlap areas between the gate electrode 4 and the drain electrode 28 and between the gate electrode 4 and the source electrode 26. Thus, the two-stage exposure can improve a transistor characteristic.

However, in manufacturing a liquid crystal display panel, there are a large number of complicated manufacturing steps, and in addition, each steps requires time-consuming work. Therefore, reduction in the number of processes not only improves the productivity but also reduces the manufacturing cost of a liquid crystal display panel in which the process cost accounts for a large proportion.

After being developed, the resist used for forming the etching stopper 14 has a size of approximately 20×10 μm per pixel, and such rectangular resists are arranged side by side over the entire surface of an array substrate. Since the area of each resist is thus small, its adhesion to the underlying nitride film (i.e., the $SiN_x$ film) is low, and hence, the resist is apt to be easily peeled off. When the resist is peeled off, the etching stopper 14 cannot be properly formed, which leads to a transistor failure.

When the etching stopper layer 10 is etched with diluted hydrofluoric acid, the layer 10 is generally over-etched so as not to leave an insufficiently etched portion. However, excessive over-etching makes the side surface of the etching stopper 14 be inclined inward at the foot thereof, resulting in the formation of a "concave" 15, which is hidden in a top view as shown in FIG. 17(c). When films and/or foreign matter to be deposited in subsequent steps are attached to the concave 15, they cannot be removed through cleaning and etching. As a result, as shown in FIG. 18, a leakage current flows between the source electrode 26 and the drain electrode 28 formed on the etching stopper 14, which leads to a leakage failure of the transistor.

SUMMARY OF THE INVENTION

As the result of researches to remove the above disadvantages, the present inventors have eventually found the present invention. An object of the present invention is to reduce the number of steps, especially the number of exposing steps in manufacture of a liquid crystal device, so as to improve the productivity and reduce the manufacturing cost.

Another object of the present invention is to prevent a failure of a transistor related to an etching stopper portion, so as to improve the yield and the quality of a liquid crystal display panel.

The liquid crystal device of the present invention comprises an etching stopper whose two pairs of opposite side surfaces are inclined at different angles. Specifically, the two pairs of opposite side surfaces of the etching stopper of the liquid crystal device are respectively etched in different steps, and hence, they are generally inclined at different angles.

Alternatively, the liquid crystal device of the present invention comprises an etching stopper, one of opposite side surfaces of which is at substantially right angles to the substrate or tapers away from the substrate. When a side surface extending along current flow is oppositely tapered, a leakage current can be caused owing to a remaining impurity and the like. Therefore, such a side surface is desired to be at right angles or normally tapered. On the other hand, when a side surface extending perpendicularly to the current flow (namely, a side surface covered with a source electrode and a drain electrode) is oppositely tapered and is not controlled, the overlap area between the gate electrode and the source (or drain) electrode can be varied, resulting in varying the parasitic capacitance of each device. Accordingly, such a side surface is preferably controlled to be at right angles or to be normally tapered. The side surface extending perpendicularly to the current flow can be also formed into a normally tapered shape through wet etching in the present invention because the covering area of the etching stopper can be large so as to reduce the over-etching amount attained when the etching is almost completed.

In the liquid crystal device of the present invention, at least one side surface of an etching stopper extending perpendicularly to current flow, namely, at least one side surface not covered with the source electrode or the drain electrode, is at substantially right angles to the substrate or tapers away from the substrate. Accordingly, no attachment such as an insufficiently etched film and an impurity remains on the etching stopper portion, resulting in preventing a leakage current from flowing between the source electrode and the drain electrode.

Alternatively, the method of manufacturing a liquid crystal display panel of the present invention comprises at least a step of simultaneously etching an etching stopper and a source/drain layer. This manufacturing method makes it possible to eliminate a concave of the etching stopper, which is formed in the channel width direction as a result of excessive over-etching, and hence, a leakage current can be prevented from flowing between the source electrode and the drain electrode.

Moreover, in the alternative method of manufacturing a liquid crystal display panel according to the present invention, a gate insulating film, a channel layer and an etching stopper layer are formed on a transparent substrate bearing a gate electrode, and the substrate is exposed to light from its back surface side by using the gate electrode as a light shielding mask by a photography technique. Then, the resist is developed, and the etching stopper layer is etched, and thereby an etching stopper is formed. This manufacturing method makes it possible to form the etching stopper through an only sigle-stage exposing step. As a result, the productivity can be largely improved, and the occurrence of formation failures of the etching stopper derived from a resist failure can be substantially avoided.

Moreover, in the method of manufacturing a liquid crystal display panel, after the aforementioned steps, a source/drain layer is formed. Then, the source/drain layer and a remaining portion of the etching stopper are etched through chemical gas phase etching by photolithography. This manufacturing method makes it possible to eliminate a concave of the etching stopper, which is formed in the channel width direction as a result of excessive over-etching, and therefore, a leakage current can be prevented from flowing between the source electrode and the drain electrode.

In the liquid crystal device, the liquid crystal display panel and the method for manufacturing them according to the present invention, exposure of an etching stopper layer includes merely one exposure process using a gate electrode as a light shielding mask. Thus, the number of exposure processes in this invention is smaller by one than that of the conventional technique. Since the method of the present invention does not include the exposure process using a light-shielding mask such as a reticle, which requires preciseness in alignment and takes a long time, the productivity can be remarkably improved.

In addition, a resist for forming the etching stopper is formed on the entire gate electrode and has a larger adhesion area than that used in the conventional technique. Therefore, the photoresist is less likely to peel off, and hence, the occurrence of formation failures of the resist can be suppressed, and the failure of transistors can be reduced. Furthermore, the manufacturing cost can be largely decreased because an expensive reticle is not necessary.

In the manufacturing method of the present invention, an etching stopper which is longer in the channel width direction than the width of a source/drain electrode under layer is formed through an exposure process from the back surface side of a substrate and an exposure process from the front surface thereof. Therefore, a reticle and another light-shielding mask used in the exposure process from the front surface of the substrate can be merely roughly aligned. As a result, not only the workability involved in the alignment can be remarkably improved but also the occurrence of failures can be largely reduced and the device quality can be stabilized.

Furthermore, the etching stopper longer in the channel width direction than the width of the source/drain electrode under layer is removed at its ends through etching simultaneously with the formation of the source/drain electrode under layer. Therefore, a resist used for forming the source/drain electrode under layer can be very easily aligned, and the occurrence of failures involved in the alignment can be substantially avoided.

Moreover, since the etching stopper longer in the channel width direction is etched at its ends simultaneously with the formation of the source/drain electrode under layer, even when over-etching in the etching of the etching stopper layer is so excessive that a concave in an oppositely tapered shape is formed, the concave extending over a source electrode and a drain electrode can be removed through etching. As a result, no leakage current flows between the source electrode and the drain electrode, and the performance and the quantity can be improved. In addition, since the concave formed through the excessive over-etching can be thus removed, resultant products can be used as good products. Thus, the occurrence of failure can be largely reduced.

BRIEF DESCRIPTION OF THE DRAWINGS

FIG. 5(a) is an enlarged plan view, FIG. 5(b) is an enlarged sectional view and FIG. 5(c) is an enlarged sectional view taken on line I—I of FIG. 5(b);

FIG. 14(a) is an enlarged plan view, FIG. 14(b) is an enlarged sectional view, FIG. 14(c) is an enlarged sectional view taken on line II—II of FIG. 14(b), and FIG. 14(d) is a sectional view taken on line III—III of FIG. 14(a);

FIG. 17(a) is an enlarged plan view, FIG. 17(b) is an enlarged sectional view and FIG. 17(c) is an enlarged perspective view of the resultant etching stopper.

DESCRIPTION OF THE PREFERRED EMBODIMENTS

Figure 1A:
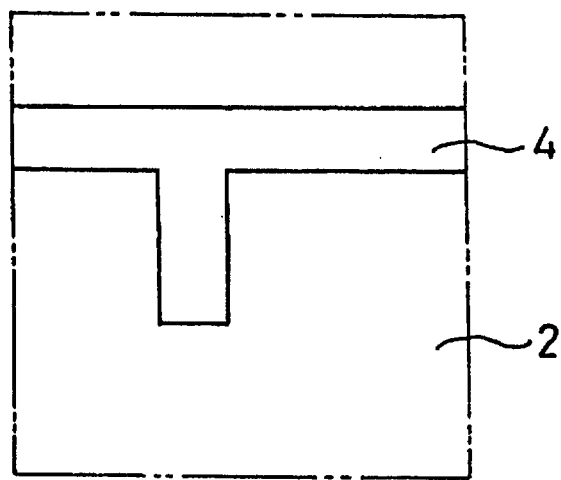
FIGS. 1(a) and 1(b) are an enlarged plan view and an enlarged sectional view, respectively, showing a procedure for forming a gate electrode in the manufacture of a liquid crystal device and a liquid crystal display panel according to the present invention.

Now, a preferred embodiment of a liquid crystal device, a liquid crystal display panel and a method of manufacturing the device and the display panel will be described with reference to the accompanying drawings. It is noted that only a portion corresponding to one pixel is shown in the drawings for simplification. In addition, the sectional views illustrate, in principle, a TFT portion, a storage capacitance portion Cs and a pad portion for simplifying the description.

Figure 1B:
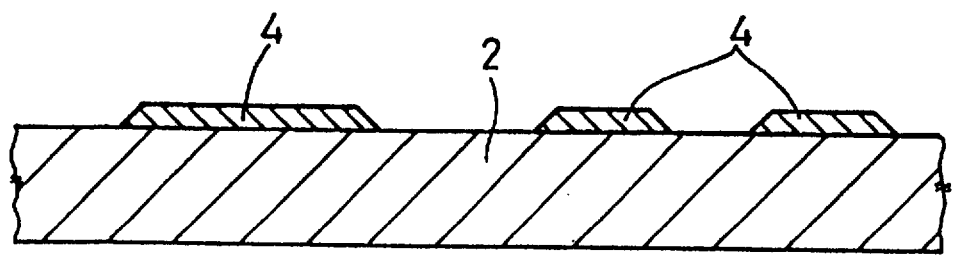

As shown in FIGS. 1(a) and 1(b), a gate electrode 4 is first formed on a transparent substrate 2. The most preferable transparent substrate 2 is a glass substrate, but can be a resin substrate or a flexible substrate as far as it is transparent and, in particular, good at heat resistance.

The gate electrode 4 consists of one or more layers of at least one element selected from the group consisting of MoW, Cr, Cu, Ni, Al, Mo, Ag and the like. Preferably, the gate electrode 4 has not only excellent conductivity but also excellent adhesion to the transparent substrate 2, and more preferably, has such a property that atoms and molecules of the electrode material are not diffused into a gate insulating film 6 to be formed thereon. Also, the gate electrode 4 is formed on the entire surface of the transparent substrate 2 by evaporating a specified metal or by adhering a metal foil. Thereafter, the resultant substrate 2 is coated with a photoresist, and subsequently subjected to stepper exposure by using a reticle. Then, the resist is developed. Subsequently, after the metal layer other than a portion working as the gate electrode 4 is removed through plasma etching, the photoresist is removed. Thus, the gate electrode 4 is formed.

Figure 2:
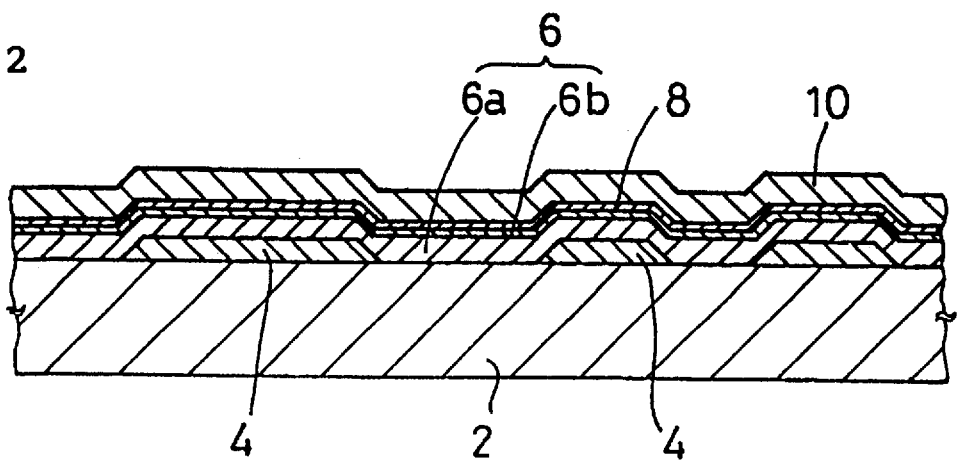
FIG. 2 is an enlarged sectional view showing a procedure for forming a gate insulating film, a channel layer and an etching stopper layer.

Next, as shown in FIG. 2, the gate insulating film 6, a channel layer 8 and an etching stopper layer 10 are successively formed in that order on the entire transparent substrate 2 bearing the gate electrode 4. The gate insulating film 6 is preferably formed from one or more layers of one or more materials. In particular, $SiO_x$ and $SiN_x$ are preferably used as the material for the gate insulating film 6, and more preferably, a $SiO_x$ film 6a is formed on the transparent substrate 2 side and a $SiN_x$ film 6b is formed on the $SiO_x$ film 6a. The formation of the $SiN_x$ film 6b is preferable to improve adhesion to the channel layer 8 which is to be formed thereon.

Furthermore, amorphous silicon (a-Si) is used as the material for the channel layer 8, and $SiN_x$ is used as the material for the etching stopper layer 10 which is to be formed thereon. All these layers are formed by a general technique.

Figure 3A:
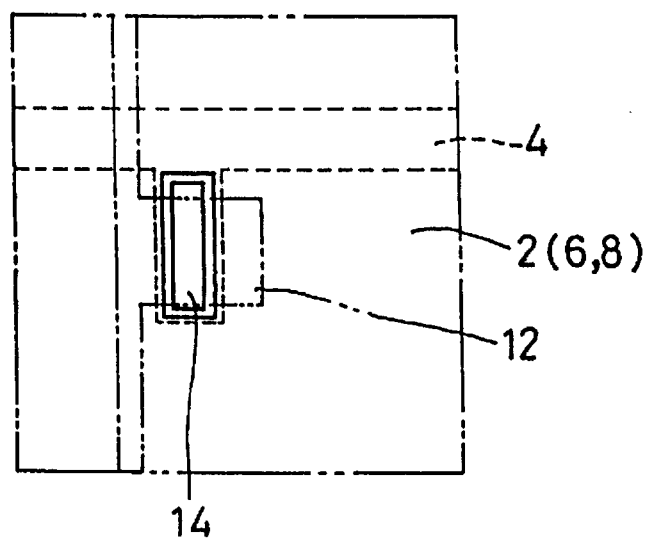
FIGS. 3(a) and 3(b) are an enlarged plan view and an enlarged sectional view, respectively, showing a procedure for forming an etching stopper.
Figure 3B:
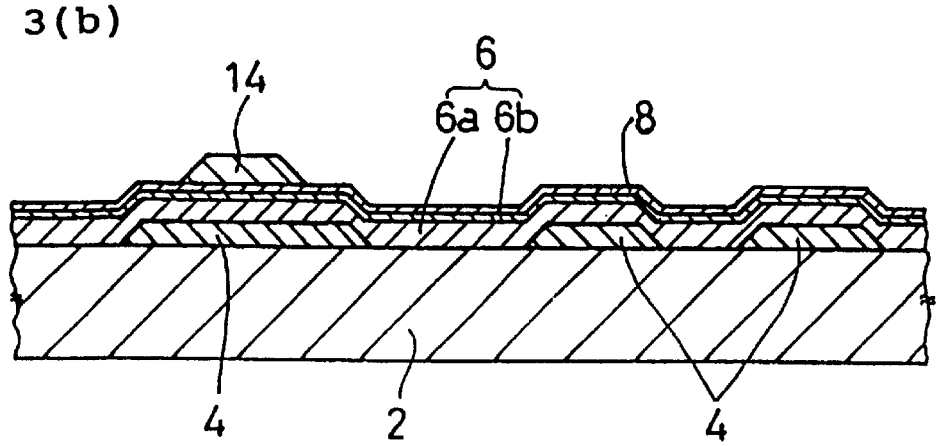

Then, as shown in FIGS. 3(a) and 3(b), after the photoresist (not shown) is applied to the etching stopper layer 10, the transparent substrate 2 is exposed to light by using the gate electrode 4 as a light shielding mask from its back surface side, that is, the surface side not bearing the etching stopper layer 10 and the like. Subsequently, the transparent substrate 2 is exposed to light from its front surface side, which is not affected by the gate electrode 4, by using a light shielding mask. When a reticle is used as the light shielding mask, stepper exposure is adopted. When a light shielding mask including a photomask covering the entire substrate 2 is used, the exposure is carried out once. Any of the reticle and other light shielding masks used in the light exposure from the front surface side of the substrate 2 includes a masking portion which is longer than at least the width (along the channel width direction) of a source/drain electrode under layer 12 to be formed in a subsequent step. Accordingly, when the photoresist is developed, areas of photoresist, which is not exposed to light in neither the exposure from the back surface side of the substrate 2 nor the exposure from the front surface side thereof. Therefore, when the etching stopper layer 10 alone is wet etched, an etching stopper 14, which is longer in the channel width direction than the source/drain electrode under layer 12 is formed as shown in FIG. 3(a). Thereafter, the photoresist is removed from the etching stopper 14. In these exposing steps, the reticle and other shielding masks used in the exposure on the front surface of the substrate 2 can be roughly aligned. As a result, the workability involved in the alignment can be remarkably improved as well as the occurrence of failure can be largely reduced, and hence, the device quality can be stabilized.

Figure 4:
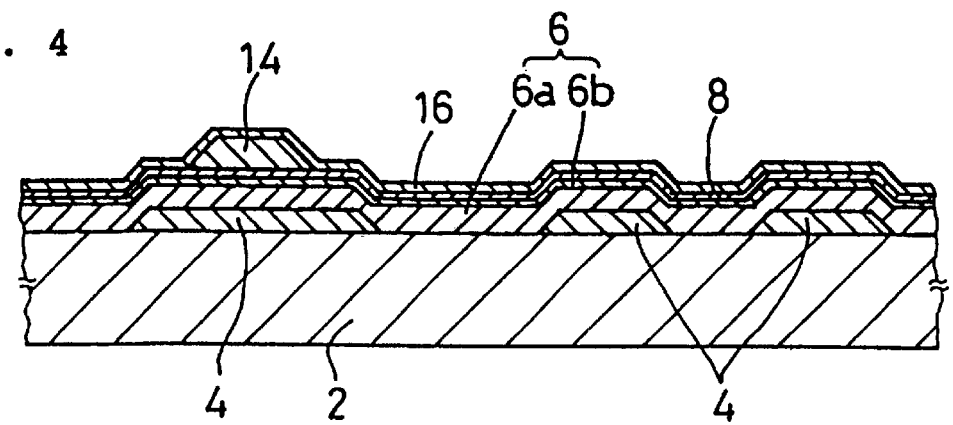
FIG. 4 is an enlarged sectional view showing a procedure for forming a source/drain layer.

Next, as shown in FIG. 4, a source/drain layer 16 is formed on the transparent substrate 2 bearing the etching stopper 14. As the material for the source/drain layer 16, $n^+$ type a-Si is generally used for attaining ohmic contact with a source electrode and a drain electrode to be formed thereon.

Figure 5A:
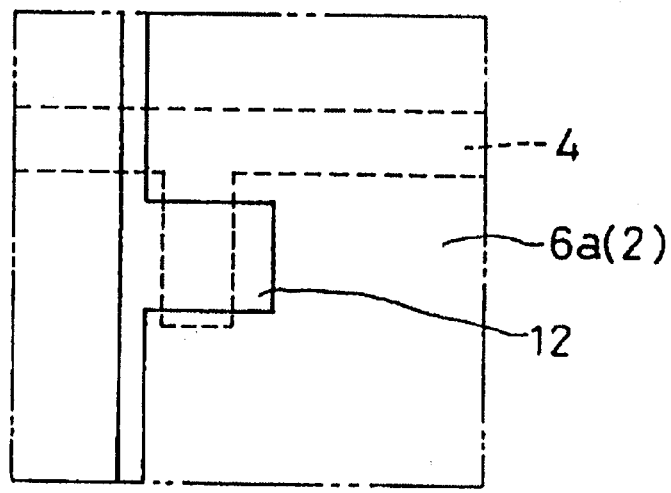
FIGS. 5(a), 5(b) and 5(c) are explanatory views illustrating a procedure for processing the source/drain layer.
Figure 5B:
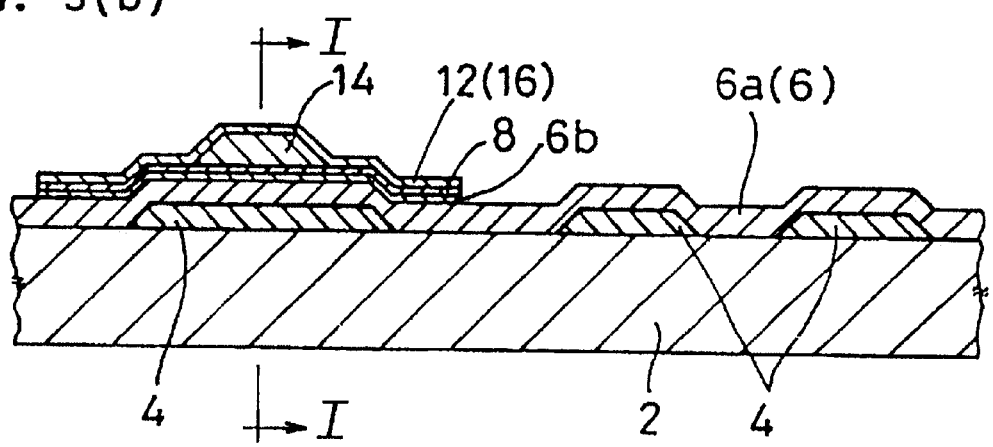
Figure 5C:
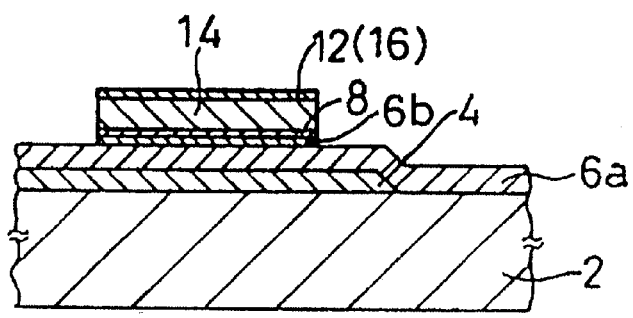

After forming the source/drain layer 16, a photoresist is applied to the resultant substrate 2. Then, as shown in FIGS. 5(a) to 5(c), the resultant substrate 2 is subjected to stepper exposure by using a reticle having a mask in substantially the same shape as a signal line including the source/drain electrode under layer 12, and plasma etching is then carried out. Through the plasma etching, the source/drain layer 16, the etching stopper 14, the channel layer 8 and the $SiN_x$ film 6b of the gate insulating film 6 are simultaneously etched into substantially the same shape as the signal line. At this time, as shown with dashed lines in FIG. 6, the both ends in the channel width direction of the etching stopper 14 are removed through the etching. As a result of this plasma etching, the source/drain electrode under layer 12, the etching stopper 14, the channel layer 8 and the $SiN_x$ film 6b are formed at substantially right angles to the transparent substrate 2 or they are tapered in that order. Thus, the angles of the tilts of the both side surfaces of the etching stopper 14 are generally different.

Figure 7A:
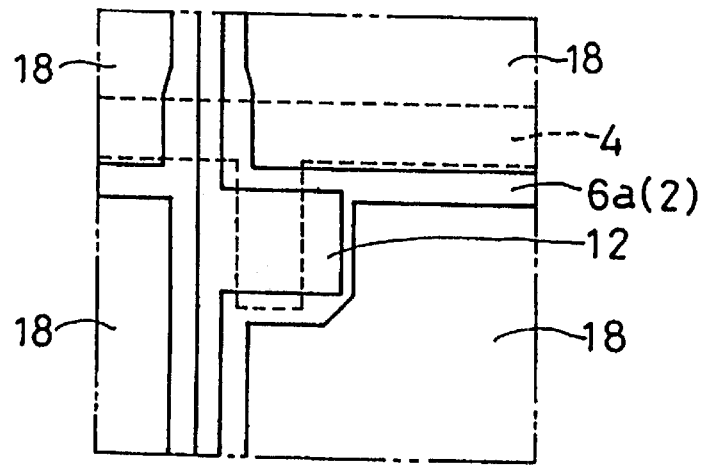
FIGS. 7(a) and 7(b) are an enlarged plan view and an enlarged sectional view, respectively, showing a procedure for forming a transparent conductive film.
Figure 7B:
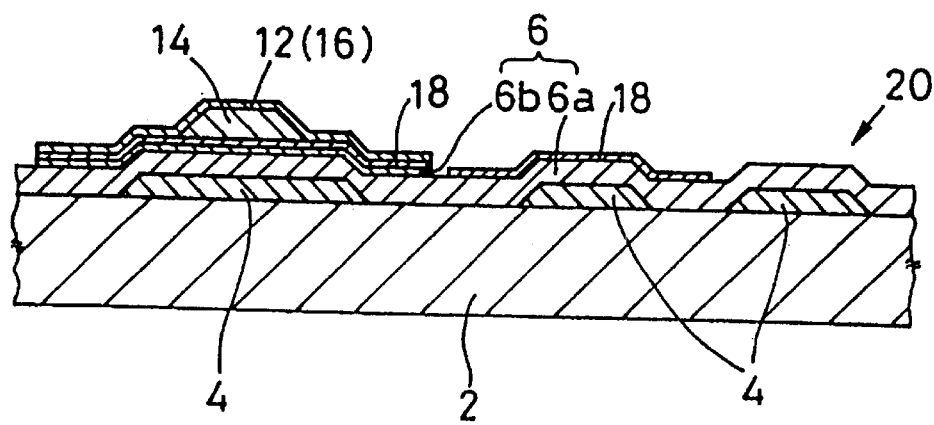
Figure 8:
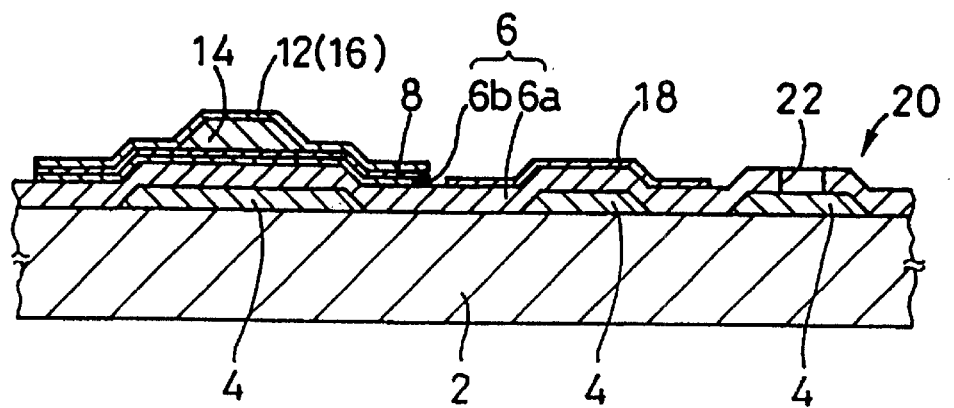
FIG. 8 is an enlarged sectional view showing a procedure for forming a through hole.

Thereafter, as shown in FIGS. 7(a) and 7(b), a transparent conductive film (not shown) of ITO or the like working as a pixel electrode layer is formed on the entire surface of the substrate 2. Then, pixel electrode layers 18 having a predetermined shape are formed by a general method comprising the steps of coating of photoresist, stepper exposure, development of the photoresist, and wet etching, and then photoresist is removed. Furthermore, coating of a photoresist, stepper exposure, development of the photoresist and wet etching are successively carried out in the same manner as the above, so that a through hole 22 can be formed in the gate insulating film 6 covering the gate electrode 4 corresponding to a pad portion 20 as shown in FIG. 8. After forming the through hole 22, the photoresist is removed.

Figure 9A:
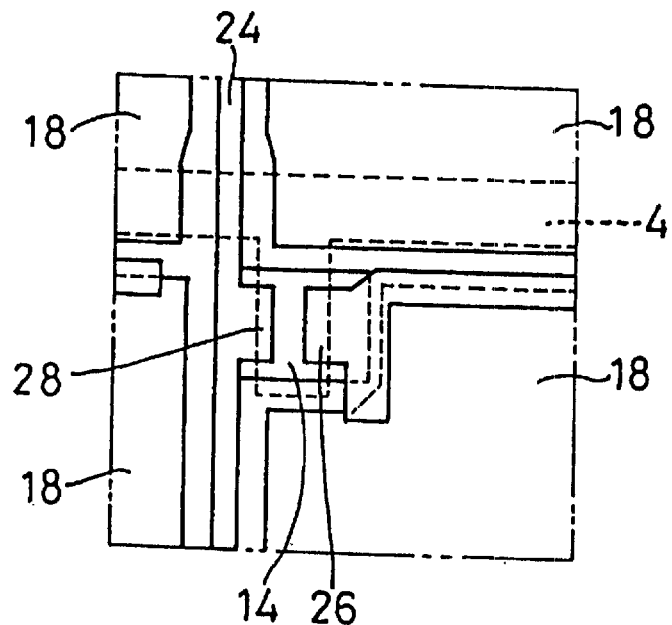
FIGS. 9(a) and 9(b) are an enlarged plan view and an enlarged sectional view, respectively, showing a procedure for forming a signal line.
Figure 9B:
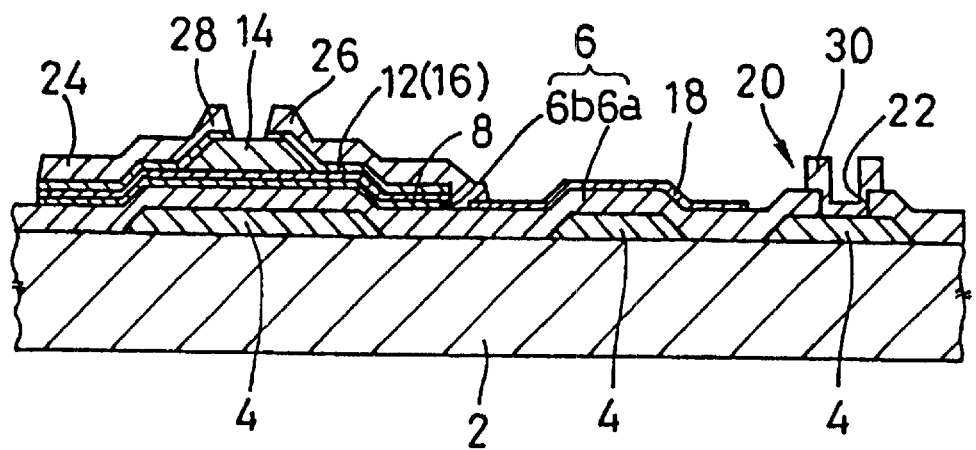
Figure 10:
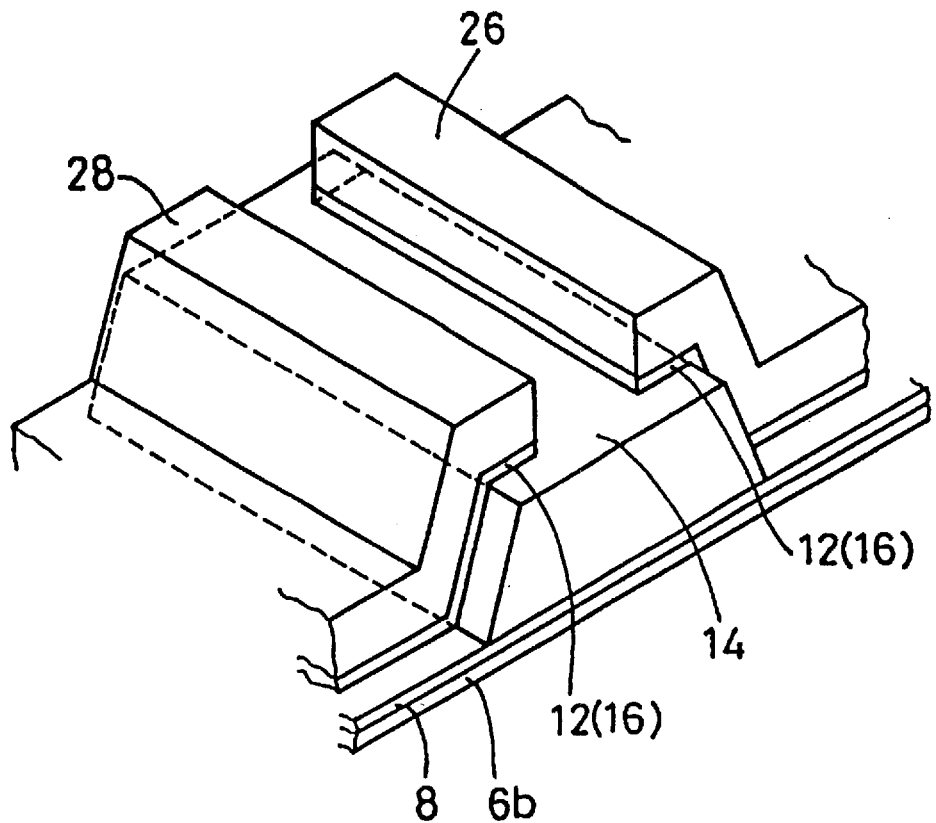
FIG. 10 is an enlarged perspective view of the liquid crystal device portion of FIGS. 9(a) and 9(b)

Then, as shown in FIGS. 9(*a*) and 9(*b*), conductive metal (not shown) is deposited to form the signal line 24, the source electrode 26, the drain electrode 28 and an electrode contact portion 30. The conductive metal consists of one or more layers of one or more metals having good conductivity. The conductive metal is preferably a lamination including a Mo layer, an Al layer and another Mo layer, but it is not limited by the above. After forming one or more layers of the conductive metal by evaporation or the like, the steps of coating of a resist, stepper exposure and development of the resist are successively carried out in the same manner as the above. Then, the conductive metal is etched by a wet etching method to form the signal line 24, the source electrode 26, the drain electrode 28 and the electrode contact portion 30. Thereafter, the source/drain electrode under layer 12 exposed between the source electrode 26 and the drain electrode 28 and the like is etched by plasma etching. In this plasma etching, the source/drain electrode under layer 12 of n$^+$ type a-Si is etched as shown in FIG. 10, however, the etching stopper 14 of SIN$_x$ remains, and hence, the channel layer 8 can be prevented from being etched.

Figure 11:
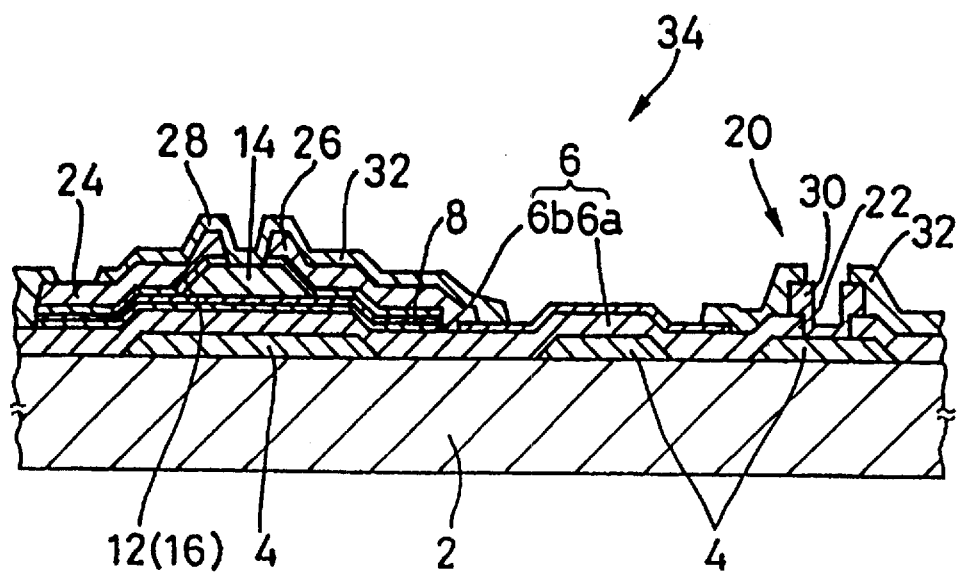
FIG. 11 is an enlarged sectional view of the liquid crystal device and the liquid crystal display panel manufactured by forming a surface protecting layer.

Next, as shown in FIG. 11, a surface protecting layer 32 is formed as necessary. The surface protecting layer 32 is made from a material having a high electric insulating property, such as SiN$_x$. After depositing such an insulating material by a general technique, a photoresist is coated, stepper exposure is conducted, the photoresist is developed, plasma etching is conducted, and the photoresist is removed. In this manner, a liquid crystal device and a liquid crystal display panel 34 covered with the surface protecting layer 32 excluding a part of electrodes and the like can be manufactured.

In the aforementioned manufacturing method, the etching stopper 14, which are longer in the channel width direction than the width of the source/drain electrode under layer 12, are formed through the exposing step from its back surface side and the exposing step form its front surface side as described with reference to FIGS. 3(*a*) and 3(*b*). Accordingly, the reticle and other light shielding masks used in the exposing step from the front surface side of the substrate 2 can be roughly aligned. As a result, the workability involved in the alignment can be remarkably improved, the occurrence of failures can be largely reduced, and the device quality can be stabilized.

Moreover, as described with reference to FIGS. 5(*a*) to 5(*c*), both end portions of the etching stopper 14, which are longer in the channel width direction than the width of the source/drain electrode under layer 12, are removed through the etching cocurrently with the formation of the source/drain electrode under layer 12. Accordingly, the resist used for forming the source/drain electrode under layer 12 can be very easily aligned, and the occurrence of failures involved in the alignment can be almost eliminated.

Figure 6:
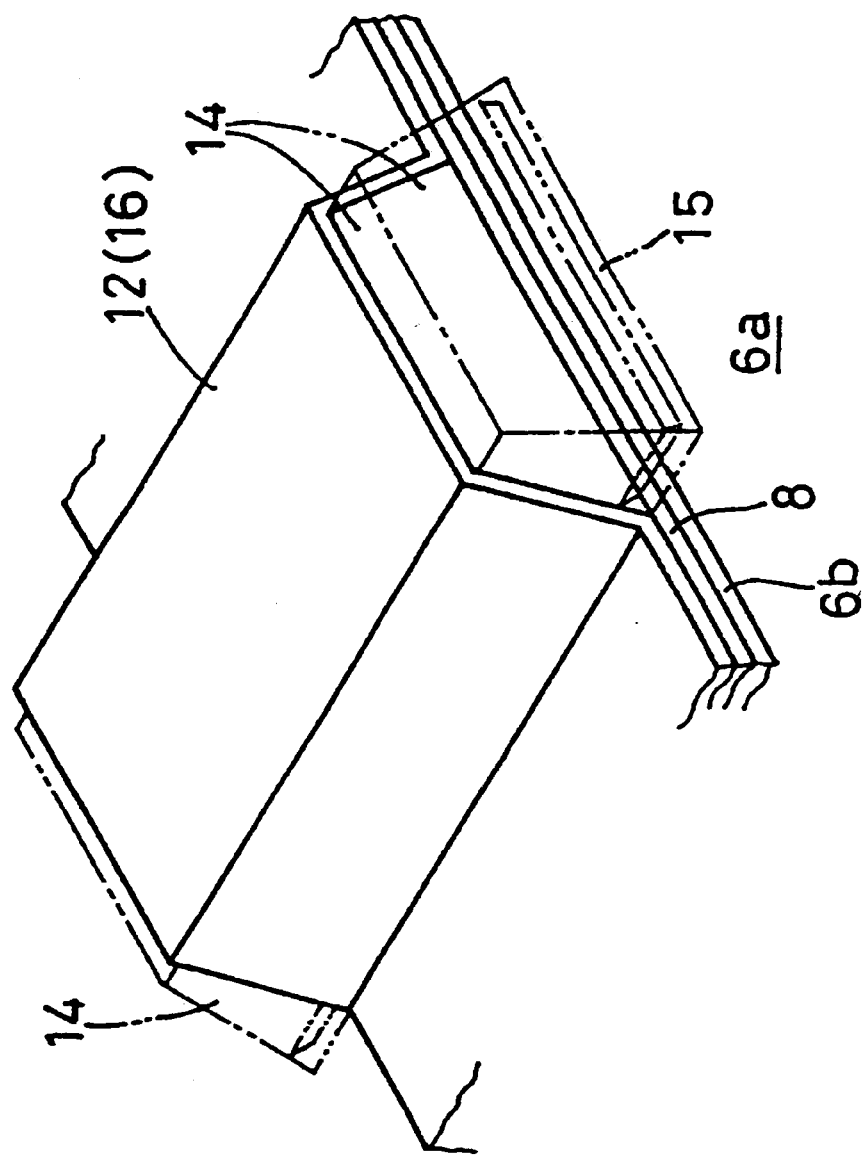
FIG. 6 is an enlarged perspective view showing a liquid crystal device portion of FIGS. 5(a) to 5(c)

Furthermore, both end portions of the etching stopper 14, which are longer in the channel width direction, are removed through the etching cocurrently with the formation of the source/drain electrode under layer 12 as described with reference to FIGS. 5(*a*) to 5(*c*) and FIG. 6. Accordingly, in etching step of etching stepper layer 10, as shown in FIG. 6, even when excessive over-etching produces a concave 15 in the shape of opposite taper, the concave 15 spreading over the source electrode 26 and the drain electrode 28 can be removed by being etched as shown in FIG. 6. As the result, since no leakage occurs between the source electrode 26 and the drain electrode 28, the performance and the quality of the resultant device can be improved. Moreover, the occurrence of failure can be significantly reduced.

One embodiment of the liquid crystal device, the liquid crystal display panel and the method for manufacturing them according to the present invention has thus been described, but the present invention is not limited to the aforementioned embodiment. Now, another embodiment will be described, in which like reference numerals are used to refer to like elements in drawings and the description of the elements is partly omitted.

For example, a gate electrode 4 is first formed on a transparent substrate 2 as shown in FIGS. 1(*a*) and 1(*b*) as in the aforementioned embodiment. Then, as shown in FIG. 2, a gate insulating film 6, a channel layer 8 and an etching stopper layer 10 are successively formed on the entire surface of the transparent substrate 2 bearing the gate electrode 4.

Figure 12A:
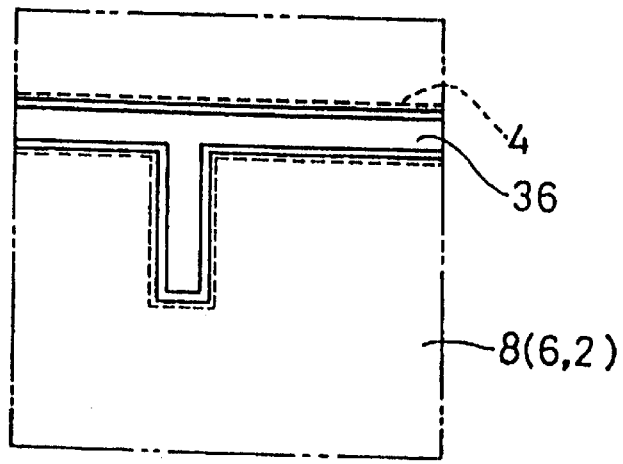
FIGS. 12(a) and 12(b) are an enlarged plan view and an enlarged sectional view, respectively, showing a procedure for forming an etching stopper in another manufacturing method for a liquid crystal device and a liquid crystal display panel according to the present invention.
Figure 12B:
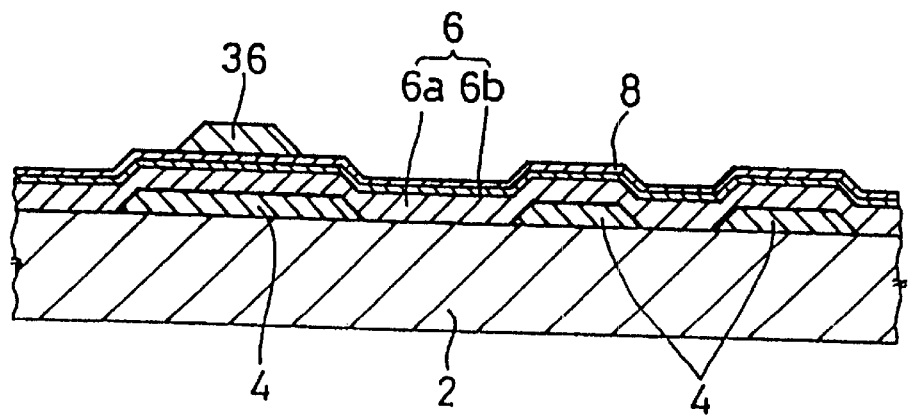
Figure 13:
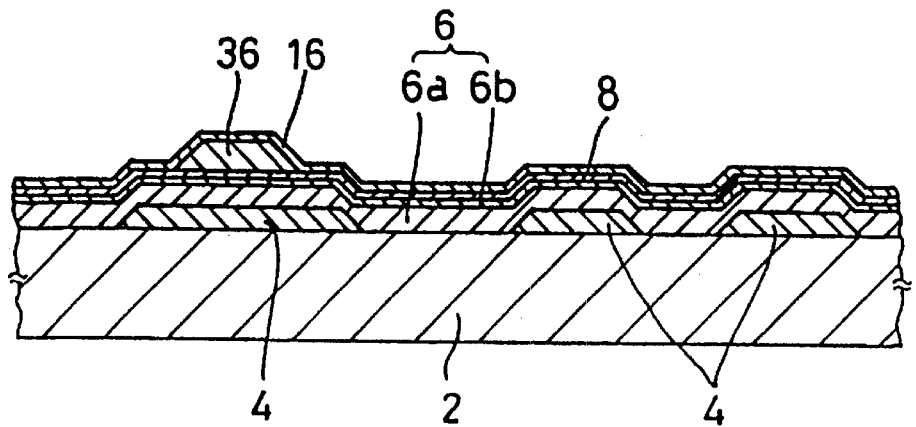
FIG. 13 is an enlarged sectional view showing a procedure for forming a source/drain layer.
Figure 14A:
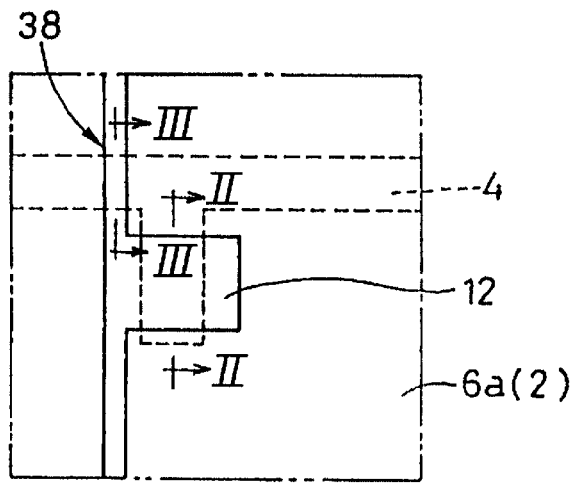
FIGS. 14(a) to 14(d) are explanatory views illustrating a procedure for processing the source/drain layer.
Figure 14B:
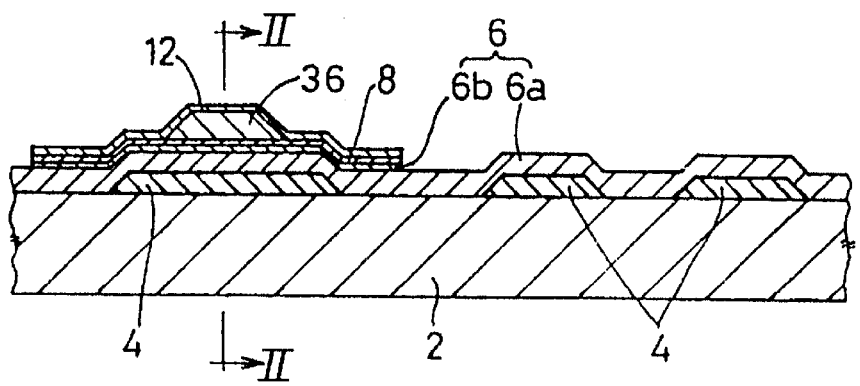
Figure 14C:
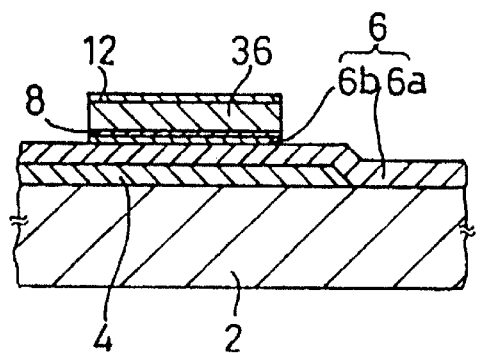
Figure 14D:
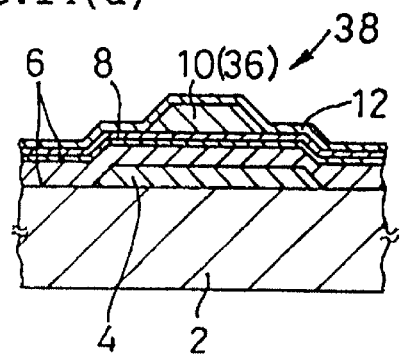
Figure 15A:
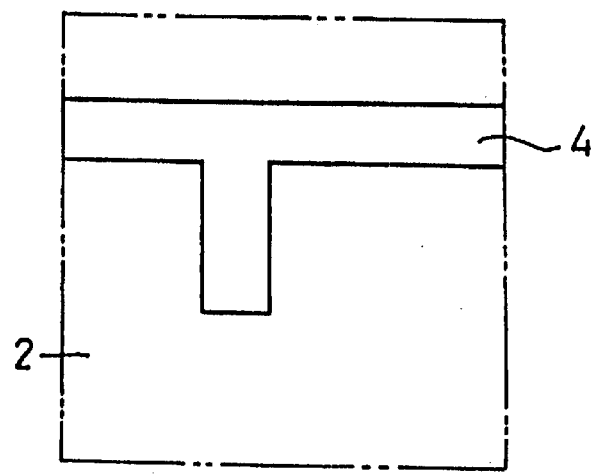
FIGS. 15(a) and 15(b) are an enlarged plan view and an enlarged sectional view, respectively, showing a procedure for forming a gate electrode in a conventional method of manufacturing a liquid crystal device and a liquid crystal display panel.
Figure 15B:
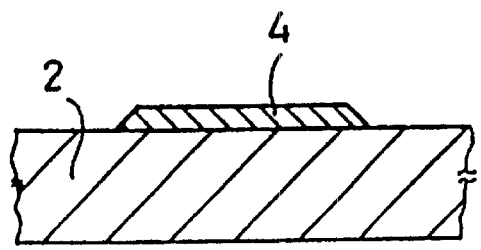
Figure 16:
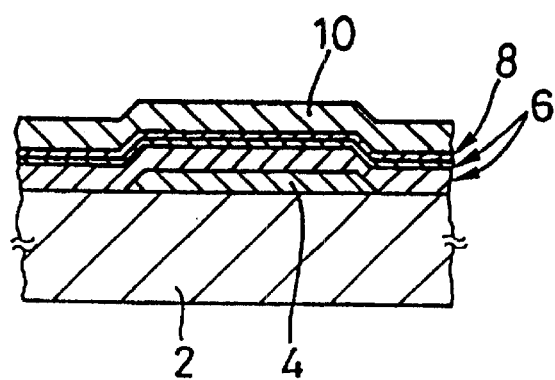
FIG. 16 is an enlarged sectional view showing a procedure for forming a gate insulating film, a channel layer and an etching stopper layer in the conventional method.
Figure 17A:
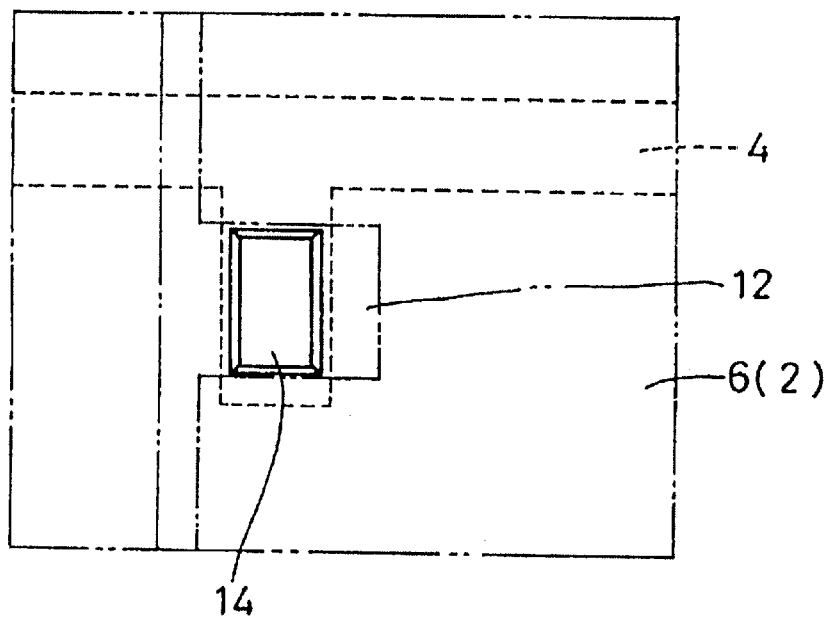
FIGS. 17(a) to 17(c) are explanatory views illustrating a procedure for forming an etching stopper in the conventional method.
Figure 17B:
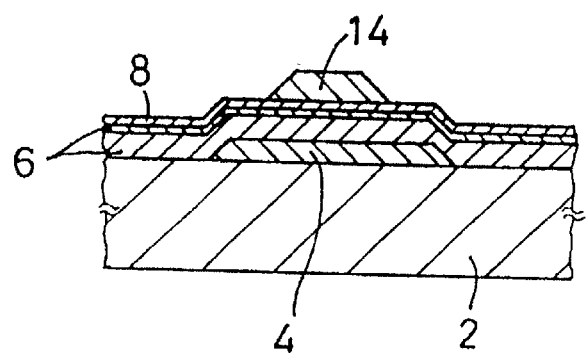
Figure 17C:
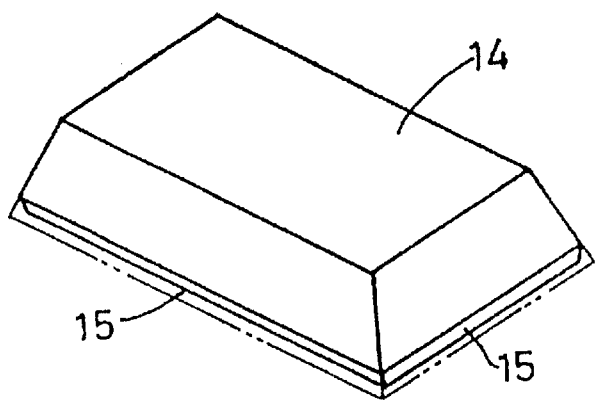
Figure 18:
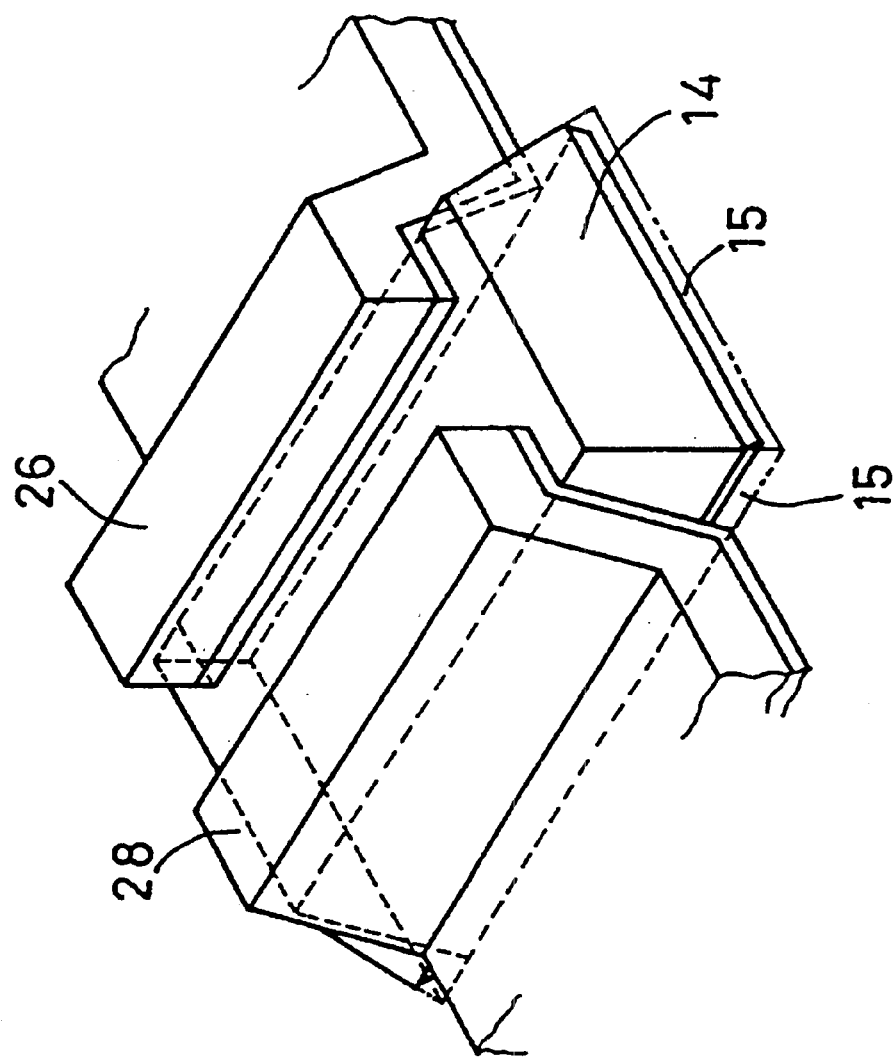
FIG. 18 is an enlarged perspective view of a liquid crystal device portion in a liquid crystal device and a liquid crystal display panel manufactured by the conventional method.

Subsequently, the resultant transparent substrate 2 is coated with a photoresist (not shown) and is exposed to light from its back surface, namely, the surface not bearing the etching stopper layer 10 and the like, by using the gate electrode 4 as a light shielding mask as shown in FIGS. 12(*a*) and 12(*b*). The photoresist is then immediately developed, and wet etching is conducted for removing the photoresist. Through this etching, an etching stopper 36 in substantially the same shape as the gate electrode 4 is formed. Thereafter, a source/drain layer 16 is formed on the transparent substrate 2 bearing the etching stopper 36 as shown in FIG. 13.

Next, the resultant transparent substrate 2 is coated with a photoresist. The substrate 2 is then subjected to stepper exposure using a reticle having a masking portion in substantially the same shape as a signal line including a source/drain electrode under layer 12 as shown in FIGS. 14(*a*) through 14(*d*), and plasma etching is carried out. Through this plasma etching, the source/drain layer 16, the etching stopper 36, the channel layer 8 and a SiN$_x$ film 6*b* of the gate insulating film 6 are simultaneously etched into substantially the same shape as the signal line (i.e., the shape of the resist for the source/drain layer 16). At this point, the ends in the channel width direction of the etching stopper 36 are removed through the etching. Also through this plasma etching, the source/drain electrode under layer 12, the etching stopper 36, the channel layer 8 and the SiN$_x$ film 6*b* are made to have side surfaces substantially at right angles to the transparent substrate 2. At the same time, an interlayer insulating film at a crossing point 38 between the signal line (12) and the gate electrode 4 is formed in a stacked layer structure including the gate insulating film 6 (of the films 6*a* and 6*b*), the channel layer 8 and the etching stopper layer 10 (i.e., the etching stopper 36).

Thereafter, a transparent conductive film such as ITO serving as a pixel electrode layer is formed on the entire surface of the substrate 2 in the same manner as in the aforementioned embodiment, thereby similarly forming a pixel electrode 18 in a desired shape (See FIGS. 7(*a*) and 7(*b*)). Then, a through hole 22 is formed in the gate insulating film 6 covering the gate electrode 4 corresponding to a pad portion 20 (See FIG. 8). Subsequently, a signal line 24, a source electrode 26, a drain electrode 28 and an electrode contact portion 30 are formed (See FIGS. 9(*a*) and 9(*b*)). Then, a surface protecting layer 32 is formed, if necessary. Thus, a liquid crystal device and a liquid crystal display panel 34 are manufactured.

This manufacturing method for a liquid crystal device and a liquid crystal display panel can attain all the effects attained by the aforementioned embodiment. Additionally, in this manufacturing method, the exposure process for forming the etching stopper layer includes merely the exposure using the gate electrode as a light shielding mask, and hence, the number of exposure processes is reduced by one as compared with that in the aforementioned manufacturing method. The exposure process using a light shielding mask such as a reticle requires very high preciseness in the alignment of the light shielding mask and takes a long period of time. Therefore, reduction in the number of such processes can largely improve the productivity.

In addition, the resist for forming the etching stopper is formed on the entire gate electrode and has a larger adhesion area than that used in the conventional technique. Therefore, the photoresist can be less likely to peel off. In the conventional technique, a photoresist used for forming an etching stopper has a small area and tends to peel off. In contrast, since the photoresist is formed on the entire gate electrode in this method as described above, the occurrence of formation failures of the photoresist is suppressed, resulting in reducing the failure of transistors. Moreover, the manufacturing cost can be largely reduced because an expensive reticle is not necessary.

The liquid crystal device, the liquid crystal display panel and the method for manufacturing them according to the present invention have thus been described, however, the present invention can be materialized in the other embodiments.

Specifically, according to the manufacturing method of the present invention, the opposite two side surfaces of an etching stopper of a TFT liquid crystal device are generally formed at substantially right angles to the substrate as described above. However, depending upon adjustment in the alignment of a light shielding mask and the like, the effect of the present invention can be attained as far as at least one of the side surfaces is substantially at right angles to the substrate.

Furthermore, a usable resist is not limited to a wet-type resist, but can be a film-like resist for thermo-compression bonding. When the resist is of the wet type, the resist is formed by coating or spraying. Moreover, the resist can be either negative or positive. However, the shape of a light shielding mask is inverted in accordance with the type of the resist.

Furthermore, the etching method can be wet etching or dry etching selected appropriately in accordance with the material to be etched. The dry etching is not limited to plasma etching but can be any other etching method including such as chemical gas phase etching such as reactive ion etching, ion beam etching and reactive ion beam etching.

Also, the light shielding mask can be a mask formed for one exposure or a reticle-type mask which is used in repeated exposure (stepper exposure) with the mask properly moved. The light shielding mask is properly selected in consideration of the productivity and the manufacturing cost.

Moreover, the effect of the present invention can be attained by conducting a process for simultaneously etching the source/drain electrode under layer 12 and the etching stopper 14 in addition to the processes of the conventional method. In this manner, a leakage current between the source electrode 26 and the drain electrode 28 can be prevented, although the processes are more complicated.

In addition, the shape of a transparent substrate is not necessarily plane but can be curved. Thus, various changes, modifications, and improvements can be made to the embodiments on the basis of knowledge of those skilled in the art without departing from the scope and spirit of the present invention.

What is claimed is:

1. A method of manufacturing a liquid crystal display panel which includes a thin film transistor having a channel layer, an etching stopper disposed on the channel layer, and source and drain layers electrically contacting with and disposed on the channel layer, comprising the steps of:

providing the etching stopper on the channel layer, the etching stopper having ends and a length in a channel width direction;

providing a source/drain layer on the channel layer and the etching stopper, the source/drain layer having a width in the channel width direction, wherein the length of the etching stopper is longer in the channel width direction than the width of the source/drain layer;

simultaneously etching at least the etching stopper and the source/drain layer to form the source and drain layers; and removing the ends of the etching stopper.

2. A method of manufacturing a liquid crystal display panel comprising the steps of:

forming a gate electrode on a transparent substrate;

forming a gate insulating film on an entire surface of the substrate;

forming a channel layer on the gate insulating film;

forming an etching stopper layer on the channel layer, the etching stopper layer having ends and a length in a channel width direction;

forming a resist film on the etching stopper layer;

exposing the substrate to light from its back surface by using the gate electrode as a shielding mask;

developing the resist film;

etching the etching stopper layer;

removing the resist film;

forming a source/drain layer on the entire surface of the substrate, the source/drain layer having a width in the channel width direction, wherein the length of the etching stopper layer is longer in the channel width direction than the width of the source/drain layer;

forming a resist layer on the source/drain layer;

exposing the substrate to light;

developing the resist layer;

simultaneously etching the source/drain layer and a remaining portion of the etching stopper layer;

removing the ends of the etching stopper layer; and removing the resist layer.

3. The method for manufacturing a liquid crystal display panel according to claim 2, wherein the step of etching the etching stopper layer is the step of wet-etching the etching stopper layer by using diluted hydrofluoric acid.

4. The method of manufacturing a liquid crystal display panel according to claim 2, wherein the simultaneously etching step is performed through chemical gas etching.

5. The method for manufacturing a liquid crystal display panel according to claim 4, wherein the source/drain layer is made from an $n^+$ type a-Si layer.

6. The method for manufacturing a liquid crystal display panel according to claim 4, wherein the step of exposing the substrate to light is the step of conducting stepper exposure by using a reticle.

7. The method of manufacturing a liquid crystal display panel according to claim 4, further comprising, after the step of removing the resist layer, the steps of:

forming a transport electrode; and forming a signal line.

8. The method for manufacturing a liquid crystal display panel according to claim 7, wherein the signal line is made particularly from a lamination consisting of a Mo layer, an Al layer and another Mo layer.

* * * * *